US006432791B1

(12) United States Patent
Hutter et al.

(10) Patent No.: US 6,432,791 B1
(45) Date of Patent: Aug. 13, 2002

(54) INTEGRATED CIRCUIT CAPACITOR AND METHOD

(75) Inventors: Louis N. Hutter; Peter S. Ying, both of Plano; Imran Khan, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/548,061

(22) Filed: Apr. 12, 2000

Related U.S. Application Data
(60) Provisional application No. 60/129,179, filed on Apr. 14, 1999.

(51) Int. Cl.[7] .................. H01L 21/8242; H01L 21/331; H01L 21/20
(52) U.S. Cl. .................. 438/381; 438/253; 438/239; 438/352; 438/396; 438/255
(58) Field of Search ................ 438/381, 241, 438/239, 253, 329, 352, 396, 142, 244, 232, 255, 151; 437/60; 257/774, 758, 382, 675

(56) References Cited

U.S. PATENT DOCUMENTS

| | | | | |
|---|---|---|---|---|
| 4,290,186 A | * | 9/1981 | Klein et al. .................. | 438/151 |
| 5,045,966 A | * | 9/1991 | Alter .......................... | 361/313 |
| 5,356,826 A | * | 10/1994 | Natsume ..................... | 437/60 |
| 5,652,172 A | * | 7/1997 | Yung-Sung et al. ........ | 438/704 |
| 5,766,992 A | * | 6/1998 | Chou .......................... | 438/241 |
| 5,770,494 A | * | 6/1998 | Yamamoto et al. ......... | 438/232 |
| 5,837,581 A | * | 11/1998 | Cheng ......................... | 438/255 |
| 6,084,214 A | * | 7/2000 | Cunningham ............... | 438/224 |
| 6,091,154 A | * | 7/2000 | Ohkawa ...................... | 257/774 |
| 6,165,861 A | * | 12/2000 | Liu et al. .................... | 438/382 |
| 6,274,411 B1 | * | 8/2001 | Patelmo et al. ............. | 438/142 |
| 6,284,586 B1 | * | 9/2001 | Seliskar et al. ............. | 438/239 |
| 6,284,592 B1 | * | 9/2001 | Lee ............................. | 438/241 |
| 6,287,911 B1 | * | 9/2001 | Nobusawa ................... | 438/241 |
| 6,291,287 B1 | * | 9/2001 | Plasa .......................... | 438/239 |

FOREIGN PATENT DOCUMENTS

| | | | |
|---|---|---|---|
| EP | 0053654 A2 | * | 6/1982 |
| JP | 0431522 A2 | * | 6/1991 |
| JP | 405259395 A | * | 10/1993 |
| JP | 406232352 A | * | 8/1994 |
| JP | 406236973 A | * | 8/1994 |
| WO | WO-9005993 | * | 5/1990 |

* cited by examiner

Primary Examiner—Matthew Smith
Assistant Examiner—Chuong Anh Lu
(74) Attorney, Agent, or Firm—Carlton H. Hoel; W. James Brady; Frederick J. Telecky, Jr.

(57) ABSTRACT

Capacitors for integrated circuits with a common polysilicon layer for both MOS gates (274, 276, 278) and capacitor (270) lower plates but with implanted doping for the gates and masked diffusive doping for the capacitor plates.

2 Claims, 20 Drawing Sheets

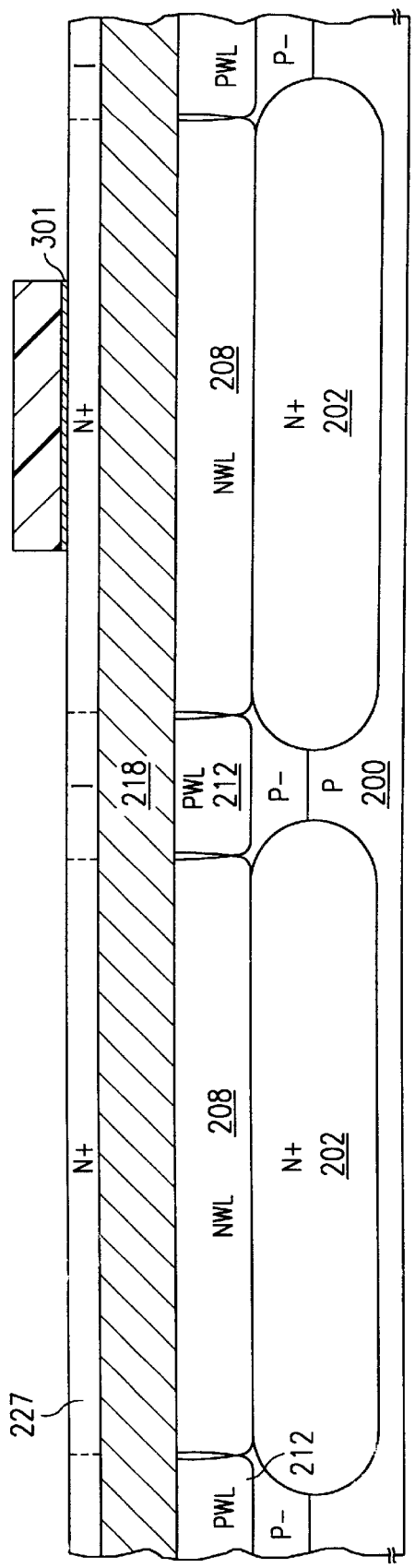
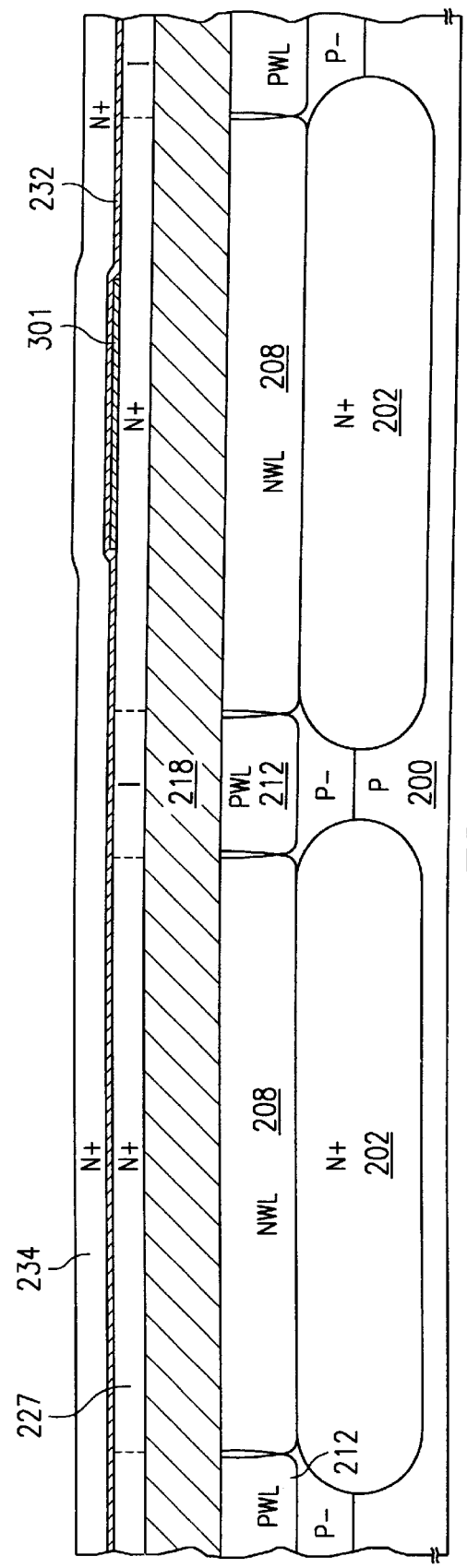
FIG. 3a
FIG. 3b

INTEGRATED CIRCUIT CAPACITOR AND METHOD

RELATED APPLICATIONS

This application claim benefit of Ser. No. 60/129,179 Apr. 14, 1999.

The following patent applications disclose related subject matter: Ser. Nos. 09/276,680, filed Mar. 25, 1999 (TI-27203). These applications have a common assignee with the present application.

BACKGROUND OF THE INVENTION

The invention relates to semiconductor integrated circuits, and more particularly to mixed signal integrated circuits and fabrication methods.

Mixed signal integrated circuits (which contain both analog and digital devices) typically include CMOS and bipolar transistors plus capacitors and resistors. Such integrated circuits compromise performance of the various devices in order to reduce process complexity. However, circuits such as 12-bit analog-to-digital converters require precision capacitors with minimal capacitance dependence upon applied voltage. But known mixed signal processes do not provide precision capacitors without undue complexity.

SUMMARY OF THE INVENTION

The invention provides a precision capacitor in a mixed signal process by use of a single polysilicon layer for both MOS gates and capacitor plates but with diffusive doping in the capacitor plates portion and implant doping in the polysilicon gates portion.

This has the advantages of high doping to limit variation of capacitance with applied voltage to the capacitors and avoidance of diffusive doping affecting MOS channel regions.

BRIEF DESCRIPTION OF THE DRAWINGS

The drawings are heuristic for clarity.

FIGS. 3a–3b show difference capacitance density capacitor preferred embodiment fabrication method steps.

DESCRIPTION OF THE PREFERRED EMBODIMENTS

Overview

Figure 1:
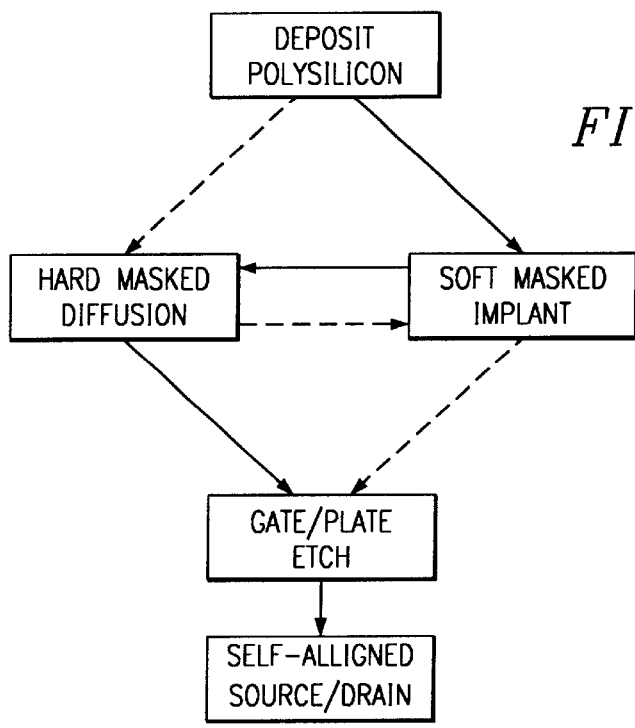
FIG. 1 is a flow diagram.

The preferred embodiments provide capacitor plates and MOS gates from a single polysilicon layer with the plates doped by masked diffusion (e.g., POCl3) together with gates doped by implantation. This provides high doping to limit capacitance dependence upon applied voltage and avoids dopant diffusion into the MOS channel region. FIG. 1 summarizes possible doping permutations; the diffusive doping requires a hard mask, whereas the implants may use soft masks. Gate doping may include either an implant prior to gate formation, the self-aligned source/drain implant, or both (as illustrated in the preferred embodiment of FIGS. 2a–2r). FIG. 1 omits the formation and doping of second capacitor plates for simplicity: the gates may be made from first or second level polysilicon with the capacitors using both levels, or there may be only one polysilicon level with the capacitors using a metal or polycide level for the other plate.

Mixed signal fabrication method

Figure 2A:
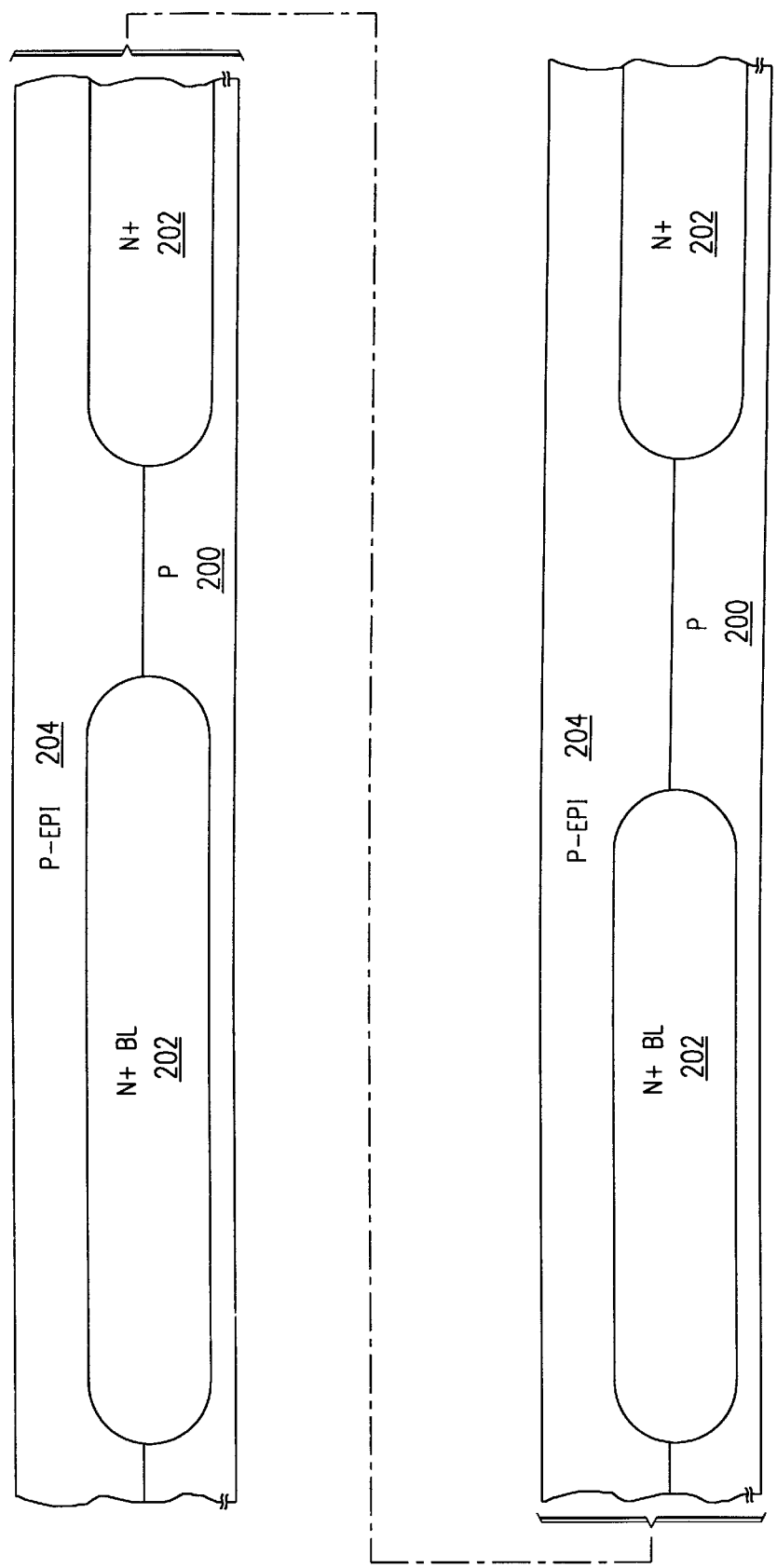
FIGS. 2a–2r are cross sectional elevation views of preferred embodiment fabrication method steps.
Figure 2B:
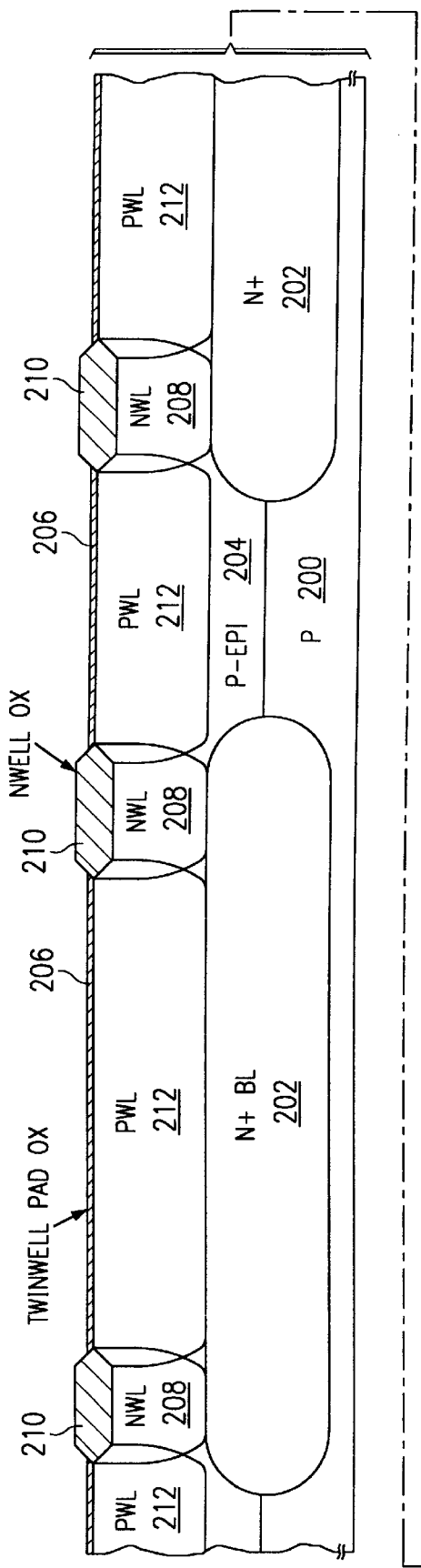
Figure 2B:
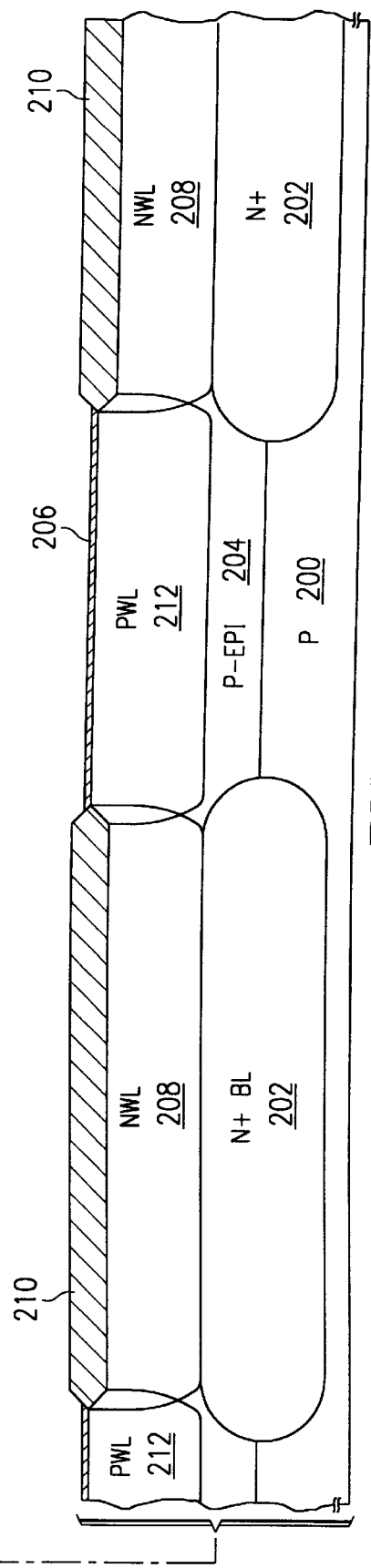
Figure 2C:
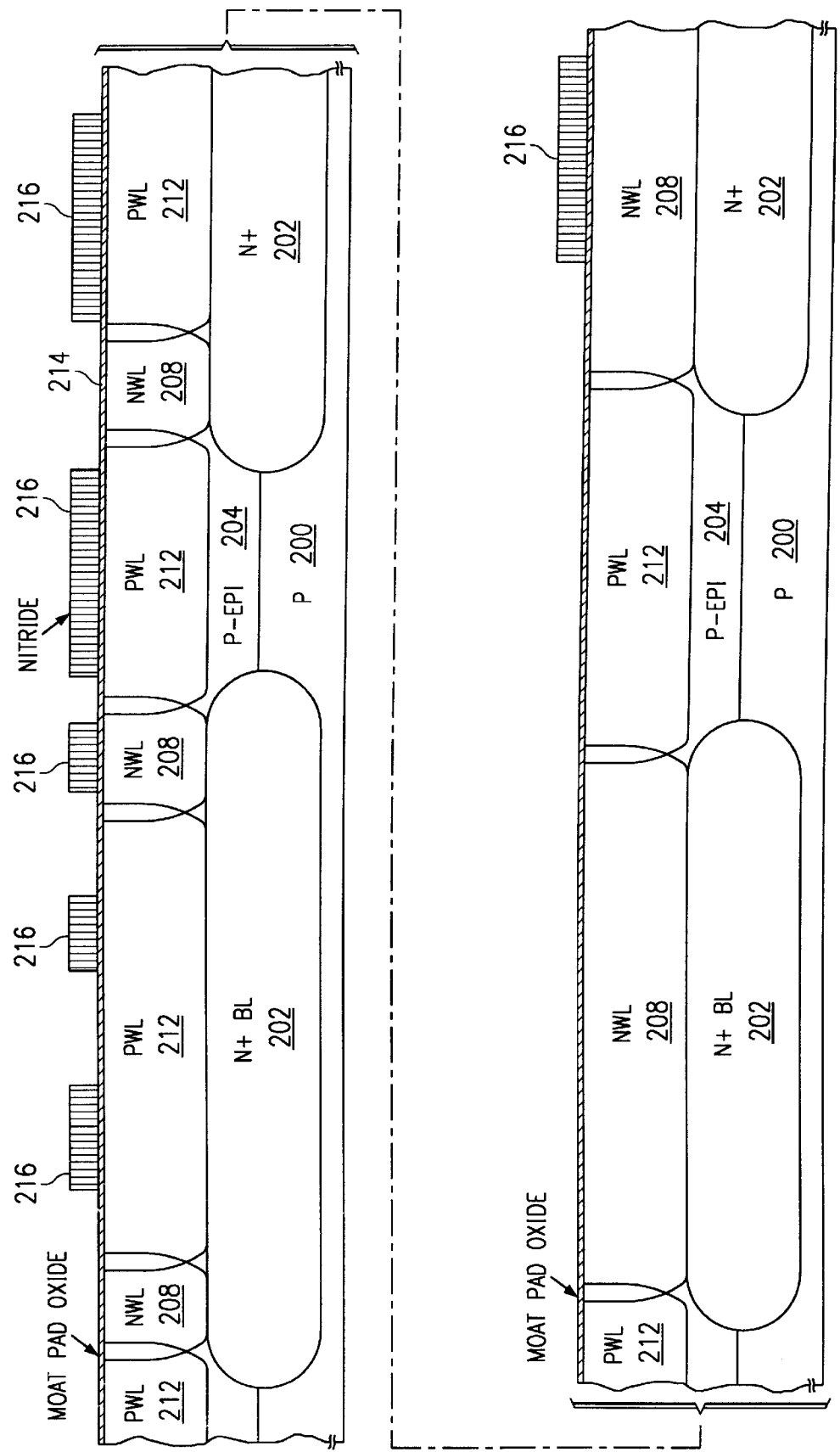
Figure 2D:
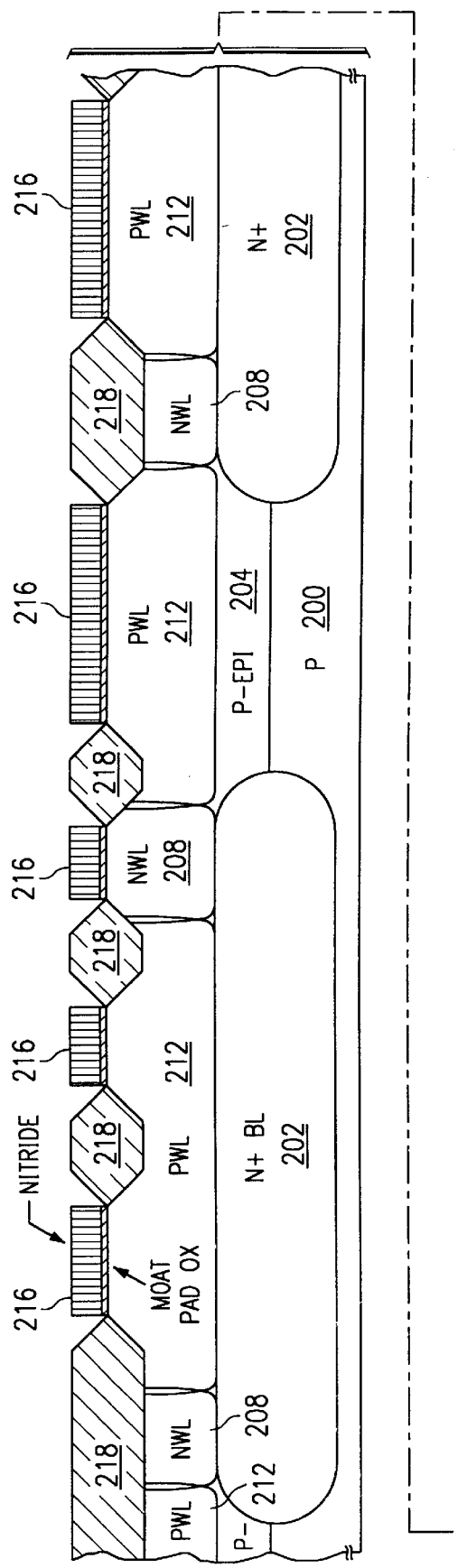
Figure 2D:
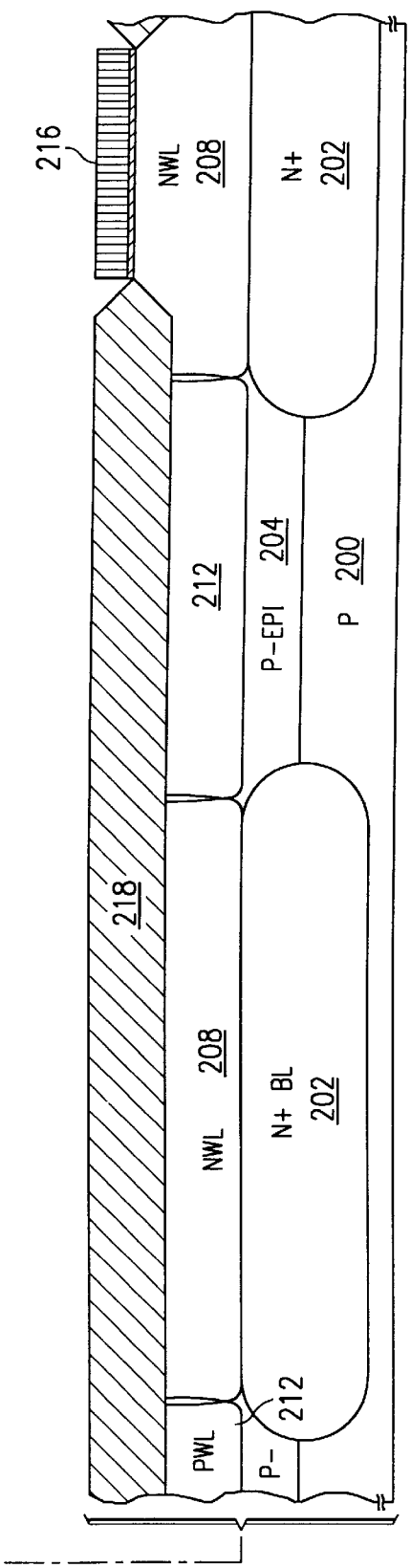
Figure 2E:
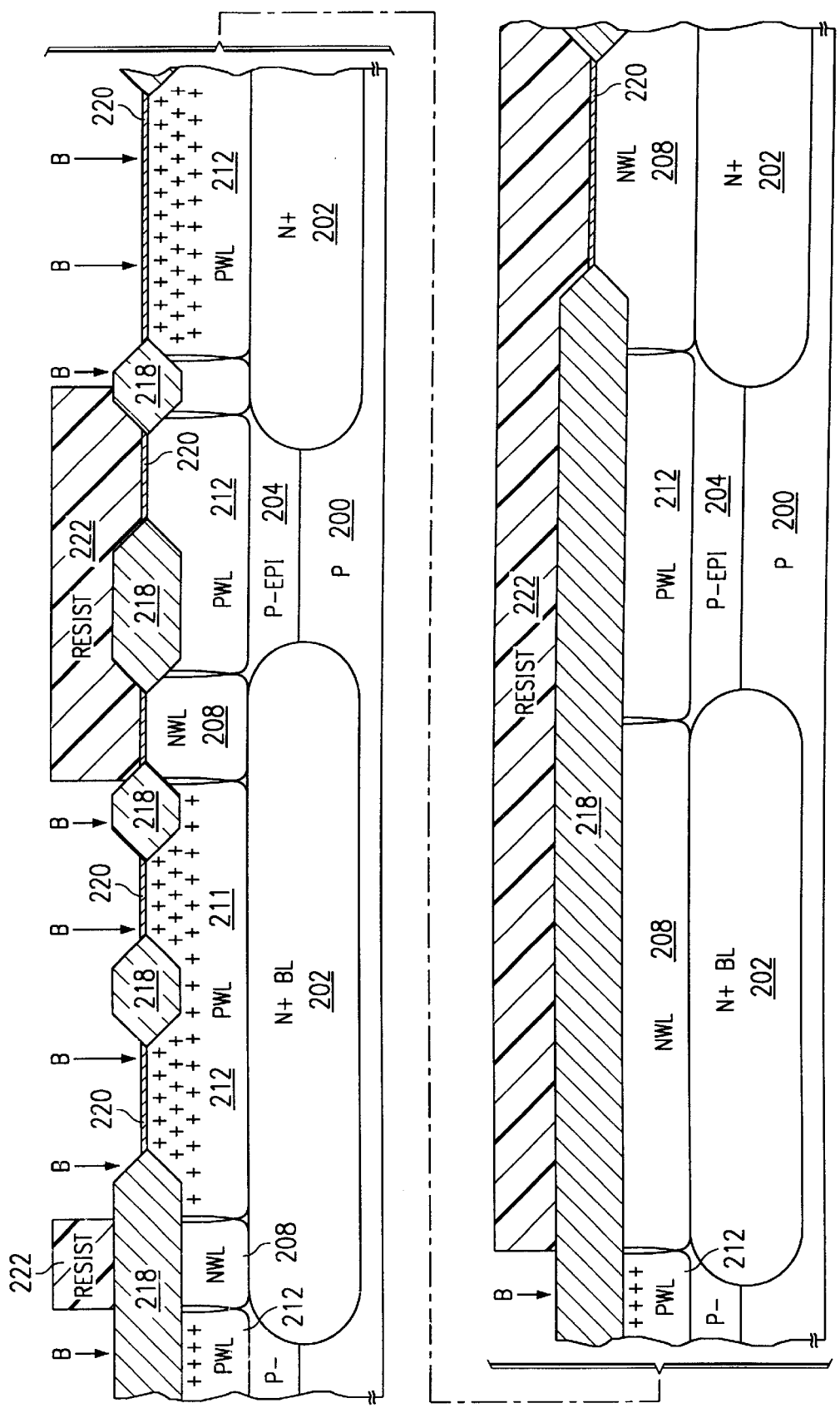
Figure 2F:
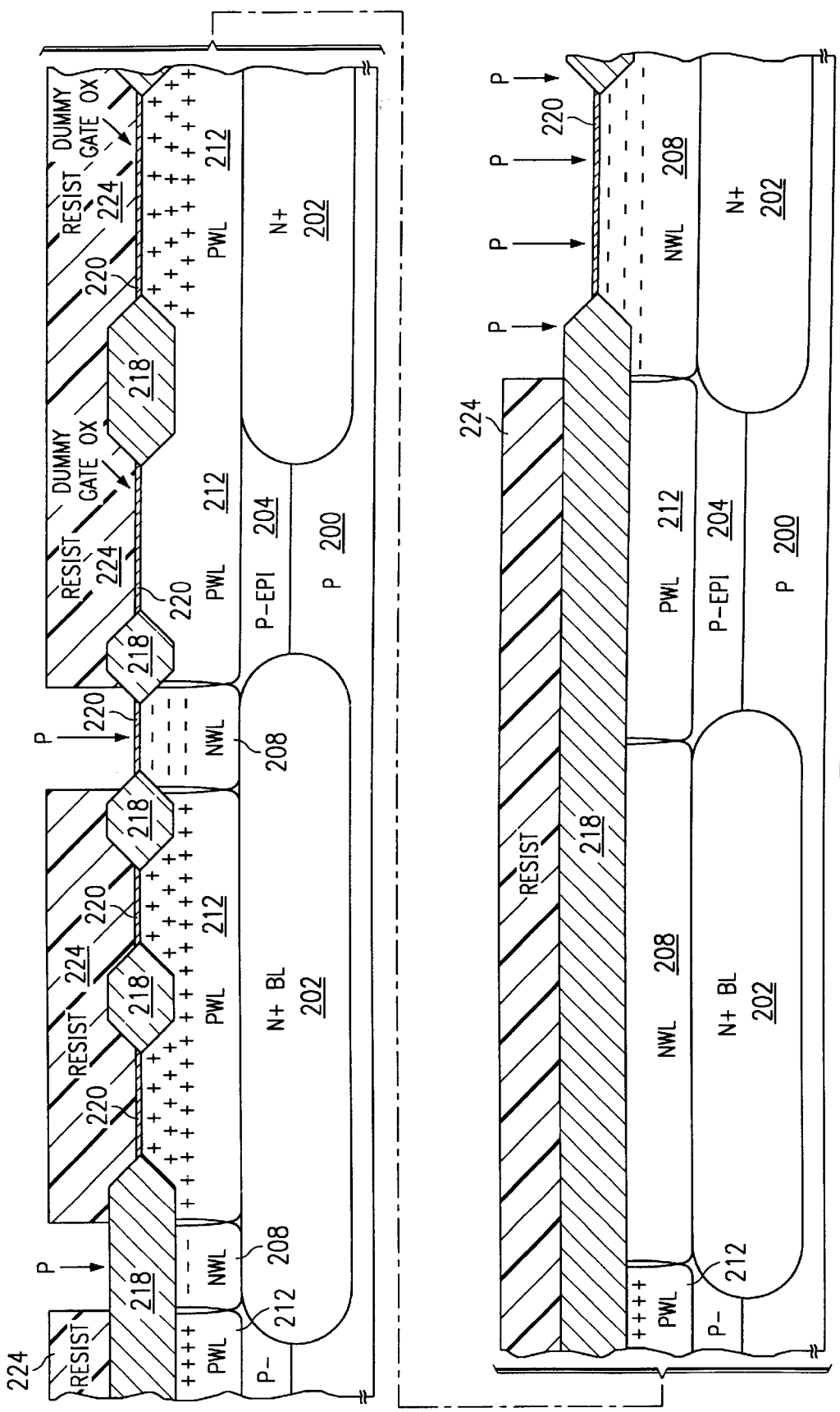
Figure 2G:
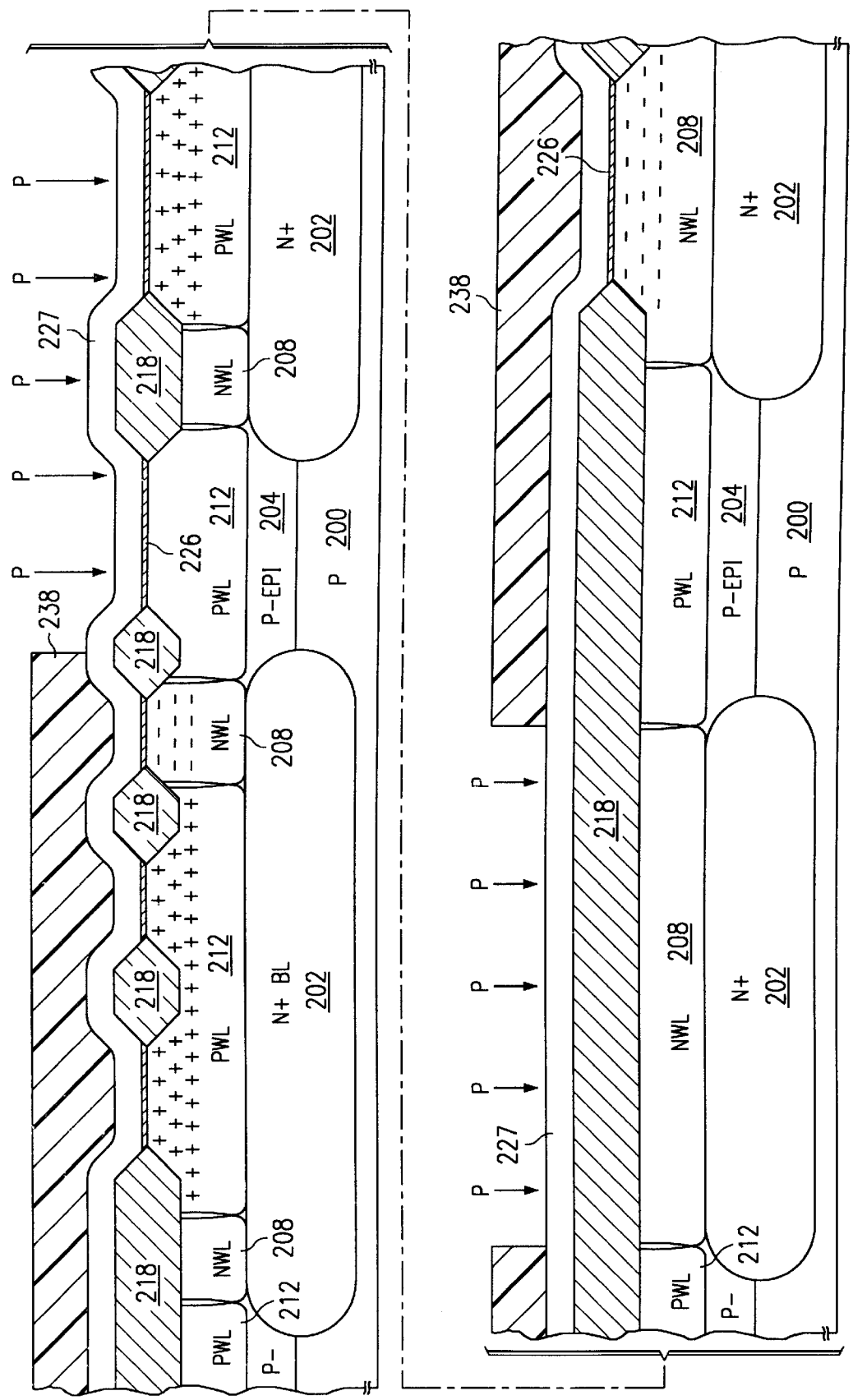
Figure 2H:
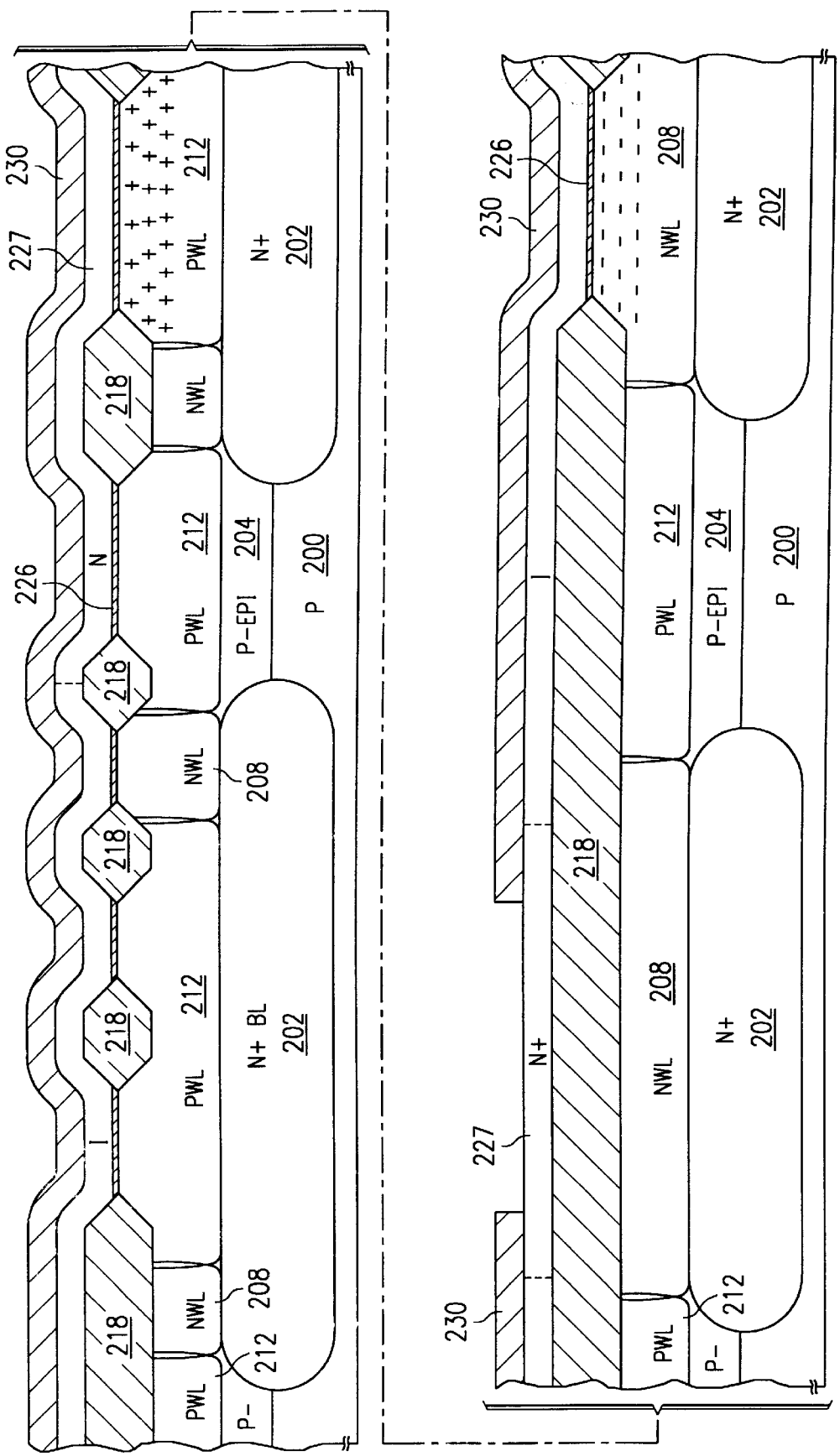
Figure 2I:
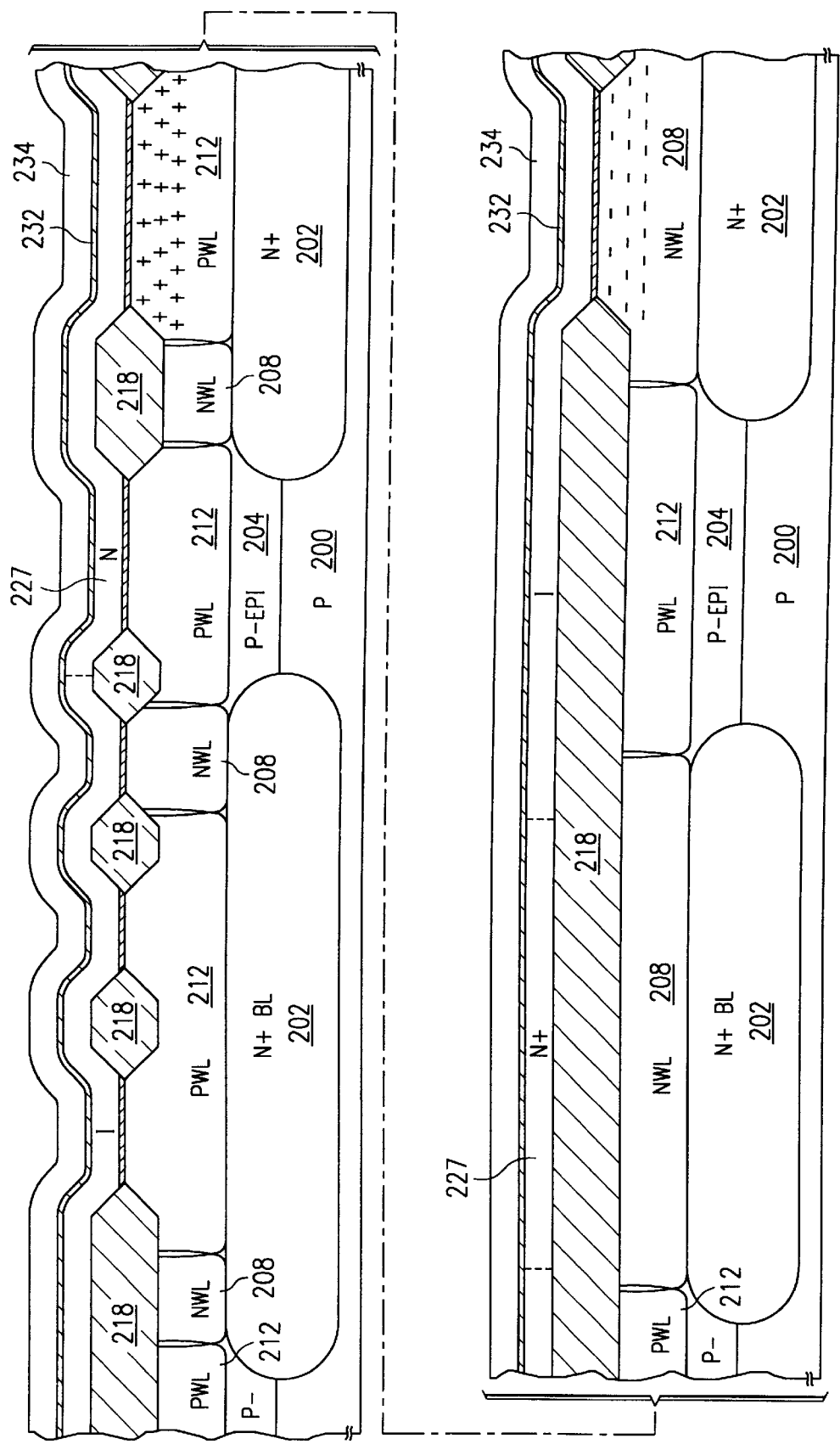
Figure 2J:
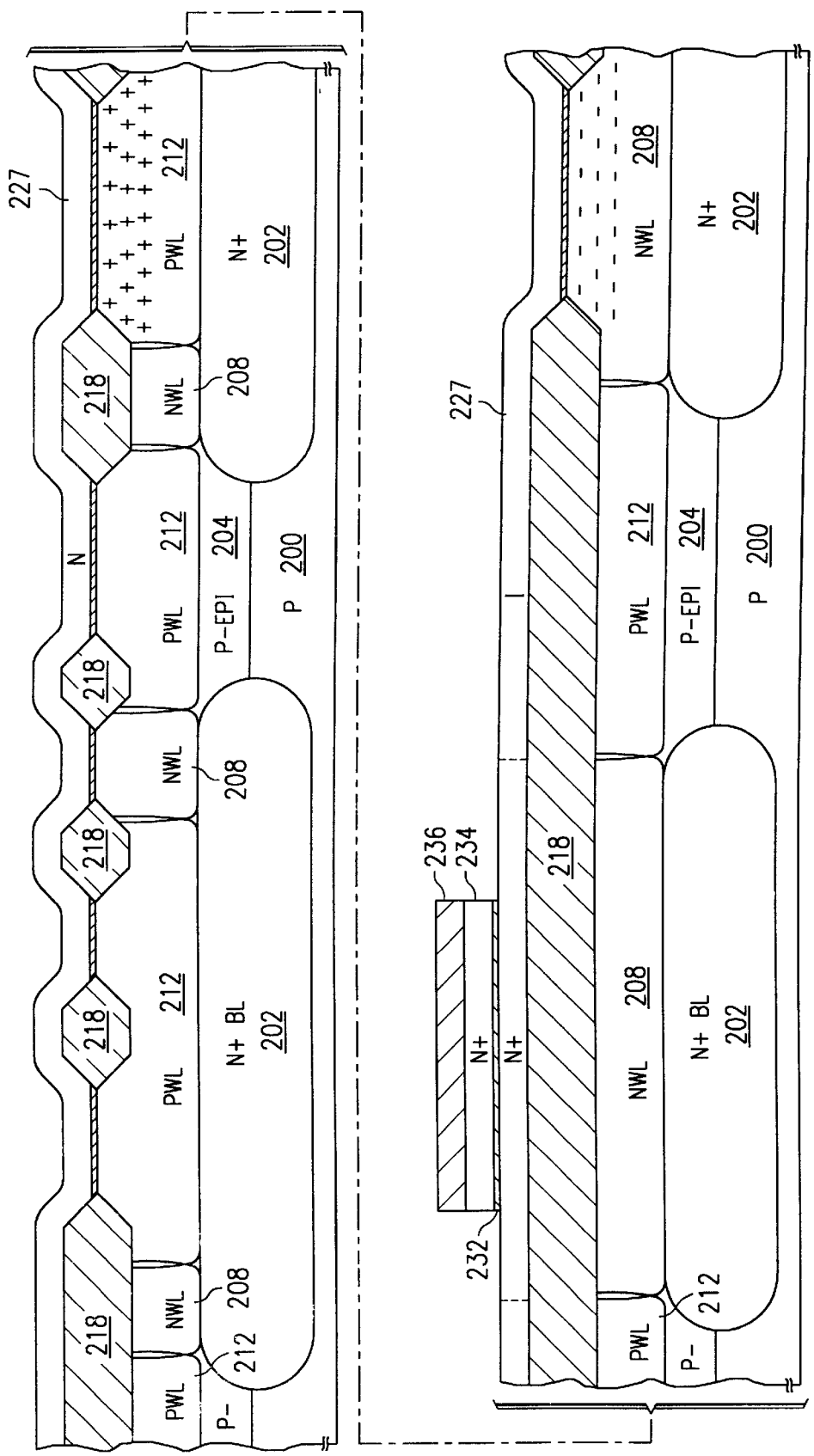
Figure 2K:
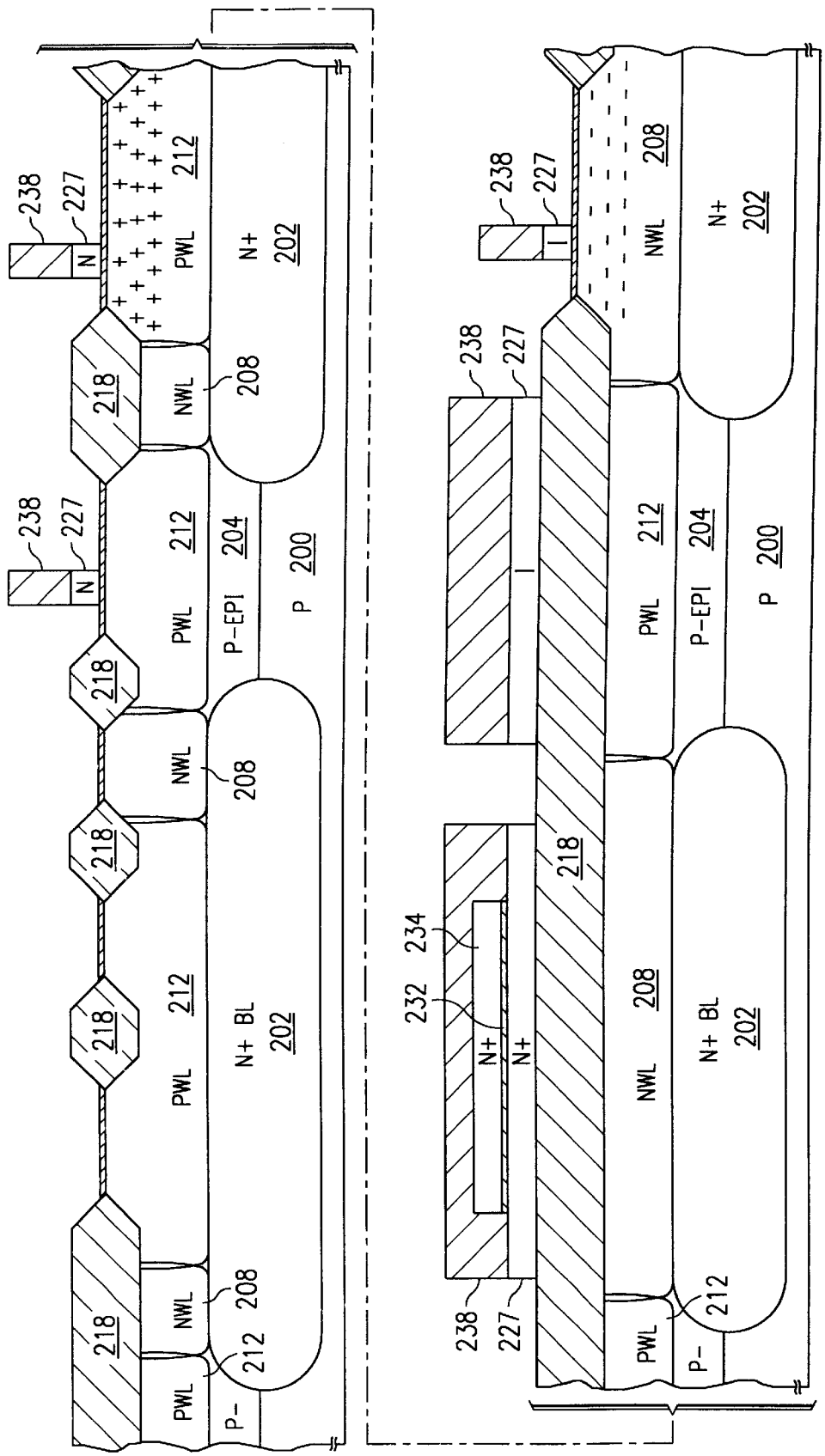
Figure 2L:
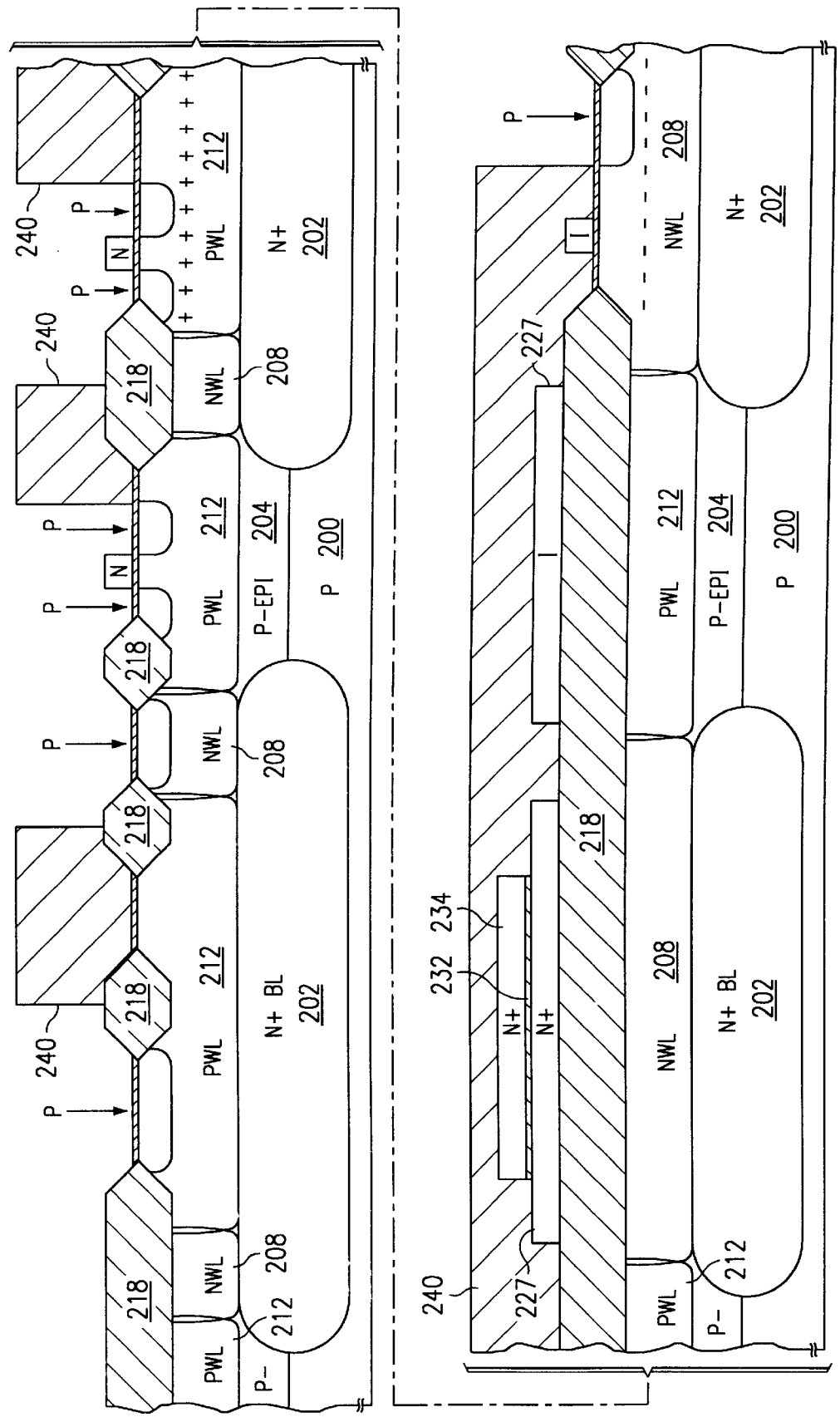
Figure 2M:
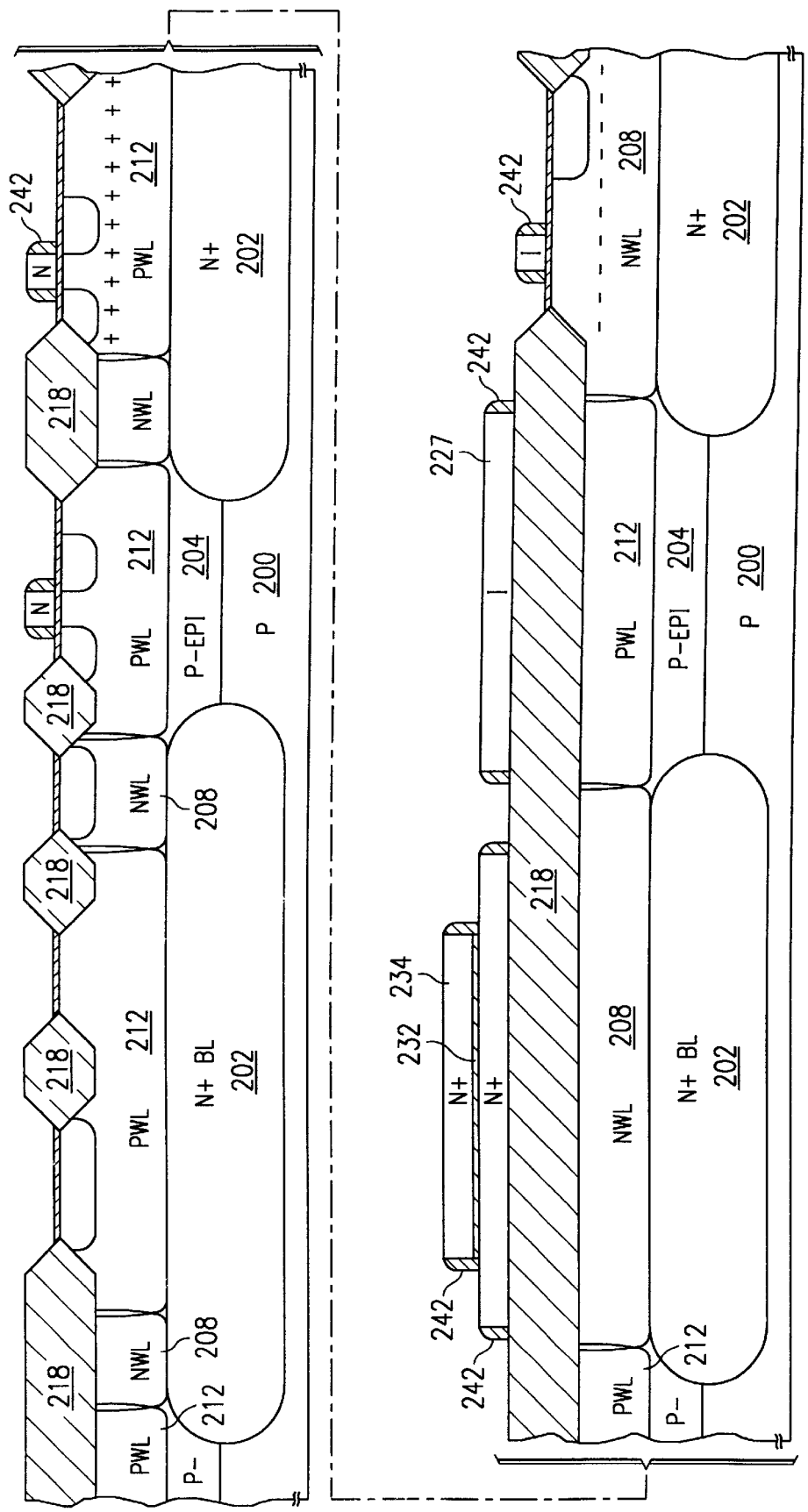
Figure 2N:
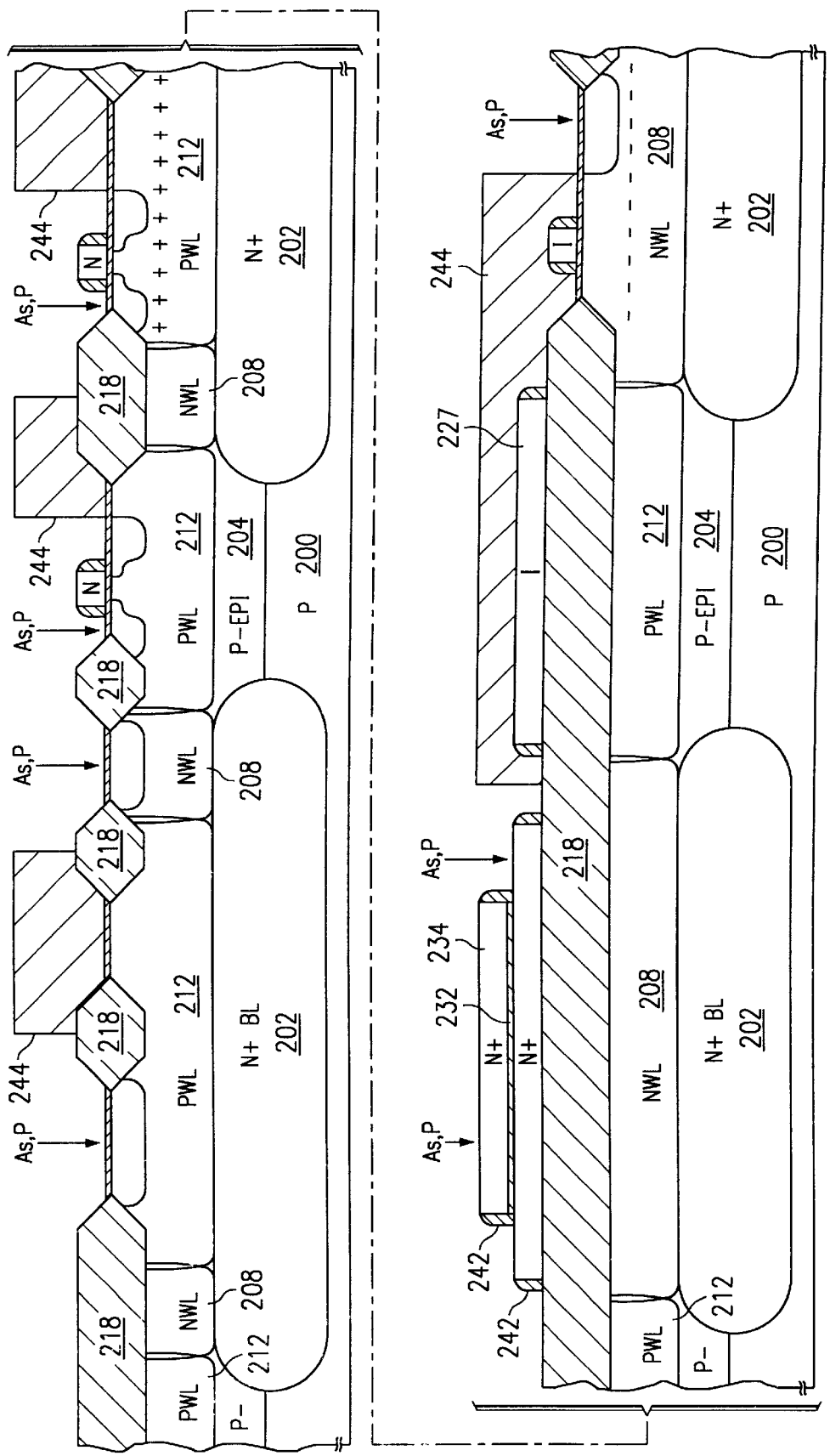
Figure 2O:
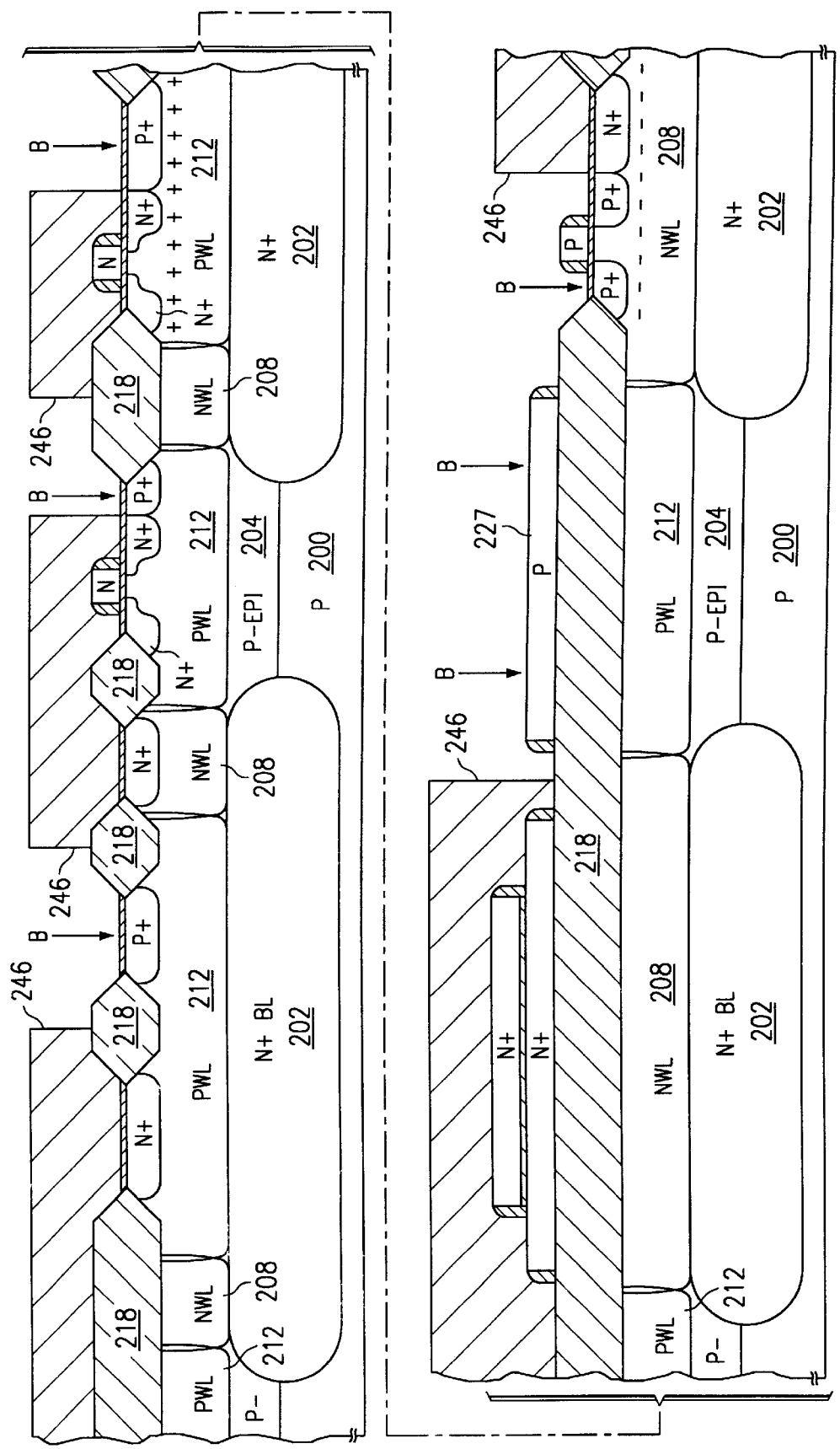
Figure 2P:
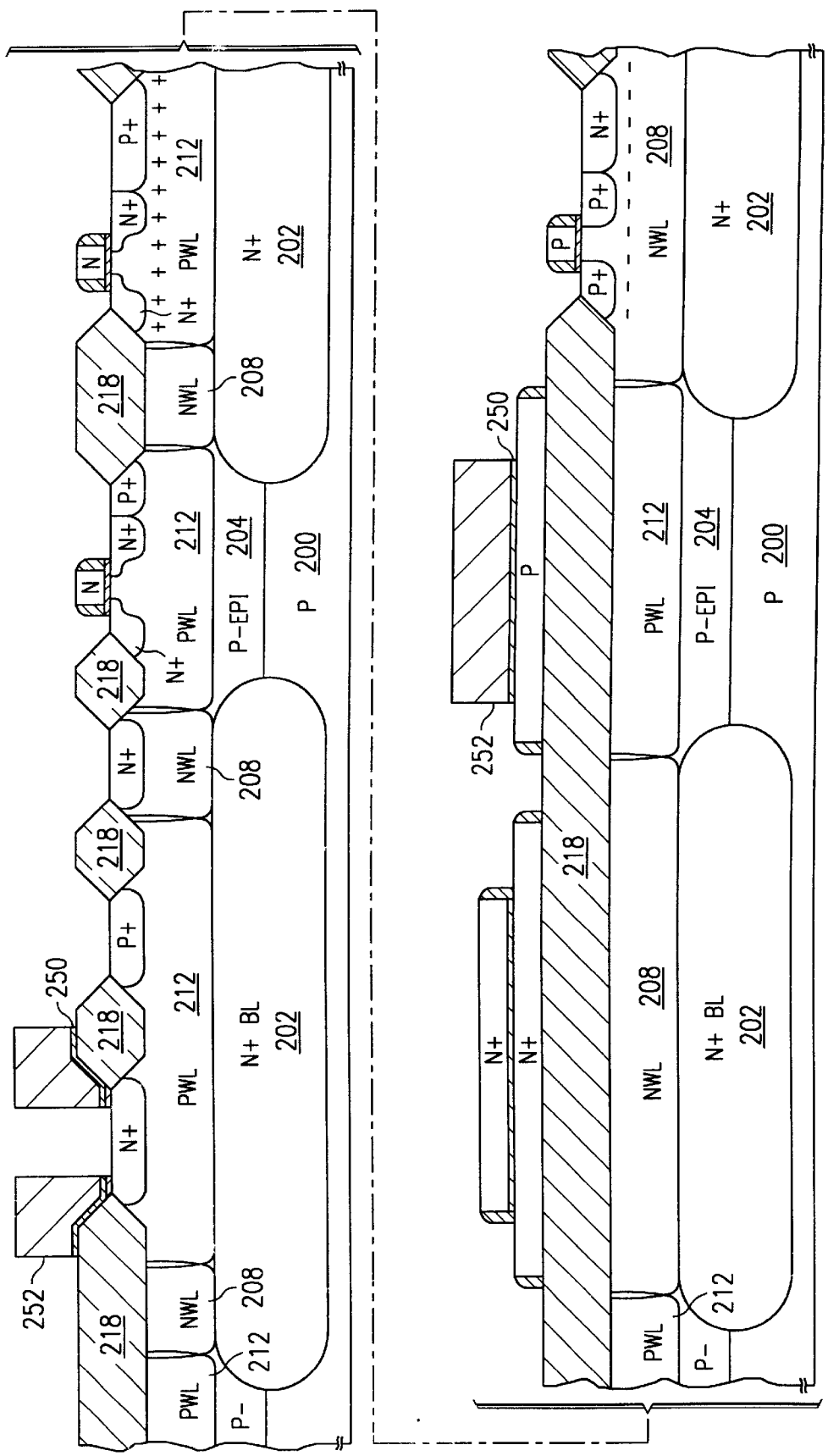
Figure 2Q:
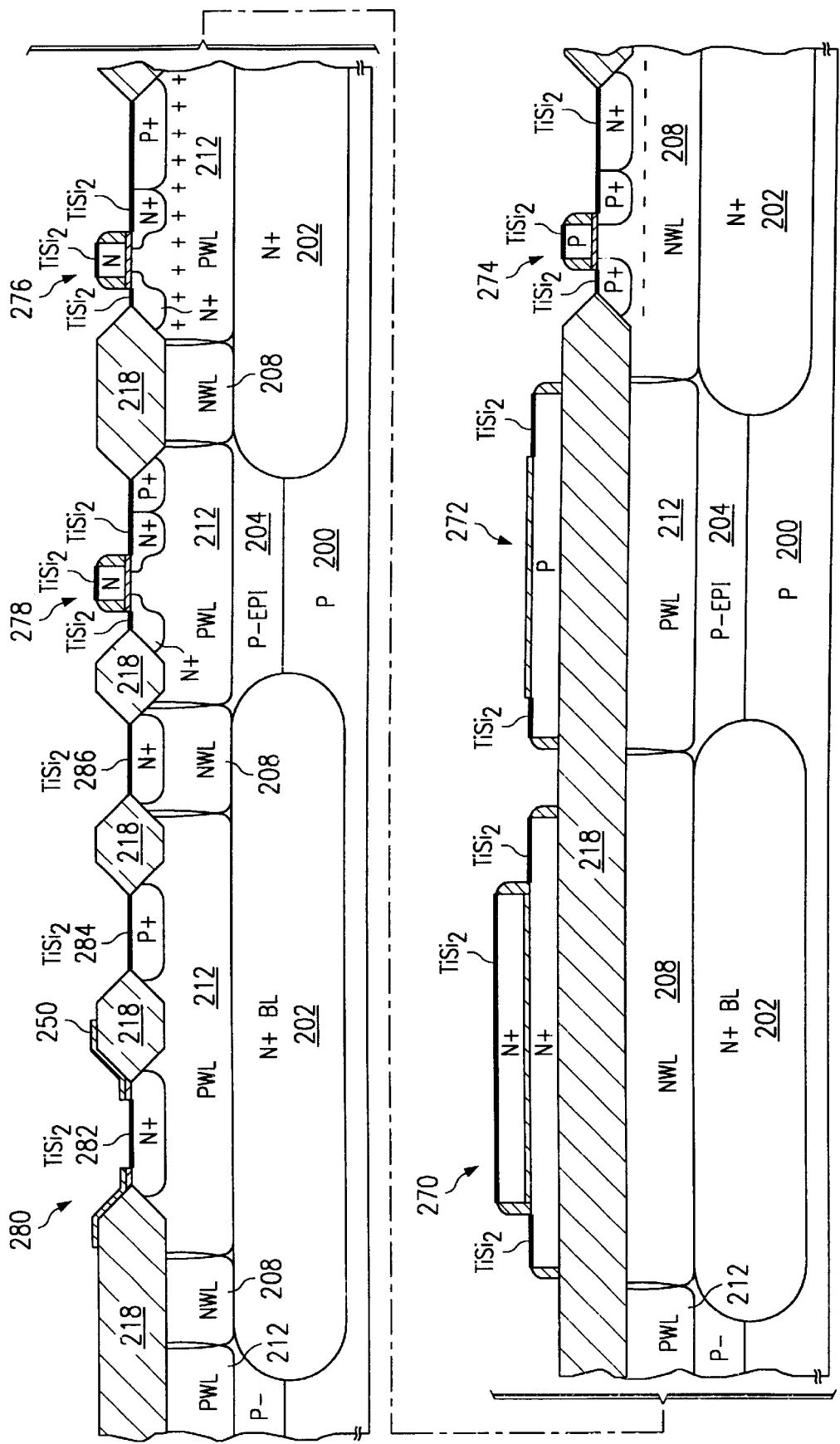
Figure 2R:
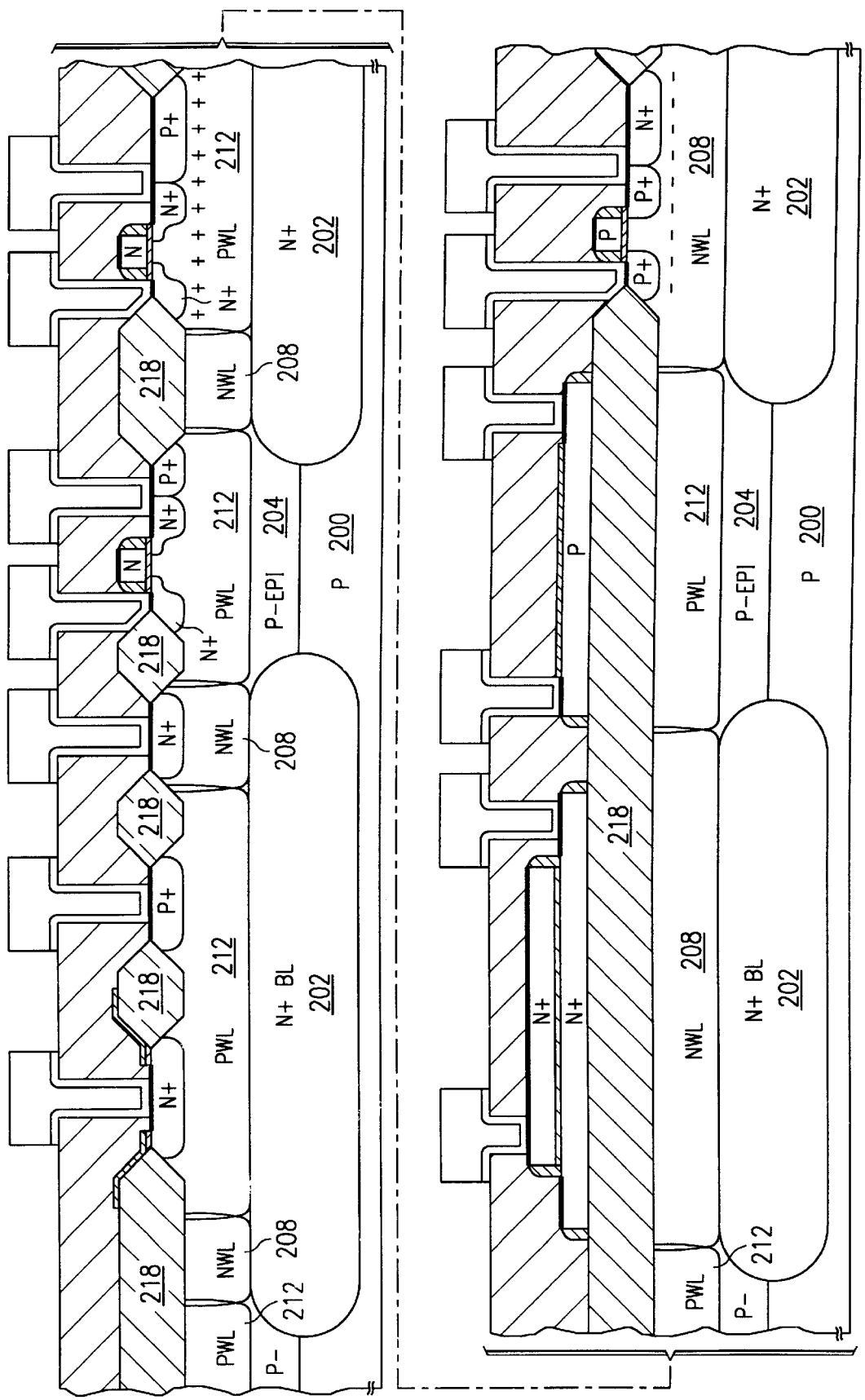

A preferred embodiment fabrication method includes the following steps as illustrated in cross-sectional elevation views by FIGS. 2a–2r which will show fabrication of six different components (from upper left to lower right): an NPN bipolar, a low Vt NMOS, an isolated NMOS, a poly-poly capacitor, a poly resistor, and a PMOS.

(1) Begin with P type silicon substrate 200 having (100) orientation and a resistivity of 6–8 ohm-cm. Alternative wafer types would include silicon-on-insulator (SOI) and n type with the conductivity types reversed in the following. First, grow an initial silicon dioxide ("oxide") layer of about 500 nm thickness. Next, spin on photoresist and expose and develop it to define the locations of N type buried layers. Then etch the oxide with the photoresist as etch mask, and strip the photoresist.

(2) Implant a $2 \times 10^{15}$ atoms/cm$^2$ dose of antimony at 60 KeV using the oxide as implant mask. Drive in the implant at 1250° C. for 30 minutes. Then strip the oxide with HF. Optionally, blanket implant a $6 \times 10^{12}$ atoms/cm$^2$ dose of boron (BF2) at 50 KeV to improve the isolation between adjacent N type buried layers 202.

(3) Epitaxially grow (e.g., thermal decomposition of dichlorosilane) 3.5 um thick silicon layer 204 with in-situ doping P type to a resistivity 6–8 ohm-cm. See FIG. 2a illustrating four N+ buried layers 202: one for each of: the NPN, isolated NMOS, capacitor, and PMOS. Note that the epitaxial growth causes antimony updiffusion so the buried layers extend into the epitaxial layer.

(4) Thermally grow pad oxide 206 to a thickness of 20 nm, and deposit (e.g., low pressure chemical vapor deposition) a layer of silicon nitride ("nitride") to a thickness of 140 nm. Spin on photoresist and expose and develop it to define the locations for N wells. Etch the nitride using the photoresist as etch mask, and then implant phosphorus through the exposed pad oxide with a dose of $1 \times 10^{13}$ atoms/cm$^2$ at 150 KeV. This phosphorus will form the N wells. Strip the photoresist and thermally grow oxide 210 over the implanted phosphorus to a thickness of 400 nm. Note that the patterned nitride prevents oxidation at its locations.

(5) Strip the nitride (e.g., phosphoric acid). Next, implant a $6 \times 10^{12}$ atoms/cm$^2$ dose of boron at 50 KeV using the oxide 210 as implant mask; this phosphorus will form the P wells and will be aligned to the N wells. Drive in the phosphorus and boron implants at 1100° C. for 8 hours to form the wells: N wells 208 and P wells 212. See FIG. 2b which shows the N well diffusing down to contact an underlying N+ buried layer.

(6) Strip oxides 206 and 210 with HF. Thermally grow new pad oxide 214 to a thickness of 20 nm, and deposit nitride 216 to a thickness of 150 nm. Spin on photoresist and expose and develop it to define the locations of active areas. Etch the nitride using the photoresist as mask and strip the photoresist; see FIG. 2c.

(7) Thermally grow field oxide 218 to a thickness of 620 nm. Oxide 218 will provide isolation between transistors and isolate capacitors and resistors from the underlying substrate. See FIG. 2d.

(8) Strip nitride 216 and underlying pad oxide 214; this removal of pad oxide 214 will also remove about 20 nm of field oxide 218. Then grow dummy gate oxide 220 of thickness 20 nm. Spin on photoresist 222 and expose and develop it to define the locations of implants for NMOS threshold, punchthrough, and channel stop plus bipolar base 211; but mask off the low threshold NMOS in the upper center portion of the Figures. Then implant boron at energies and doses for NMOS threshold voltage adjustment, punchthrough suppression, and channel stop (under field oxide) of $1.5\times10^{12}$ atoms/cm$^2$ at 20 KeV, $4\times10^{12}$ atoms/cm$^2$ at 70 KeV, and $2\times10^{12}$ atoms/cm$^2$ at 180 KeV, respectively. These implants also augment the base 211 doping for the NPN bipolar; see FIG. 2e. Note that the implants could be omitted from the NPN to increase the gain.

(9) Strip photoresist 222. Then spin on photoresist 224 and expose and develop it to define the locations of implants for PMOS threshold, punchthrough, and channel stop. Then implant phosphorus at energies and doses for PMOS threshold voltage adjustment, punchthrough suppression, and channel stop (under field oxide) of $1.5\times10^{12}$ atoms/cm$^2$ at 50 KeV, $5\times10_{12}$ atoms/cm$^2$ at 150 KeV, and $2.5\times10^{12}$ atoms/cm$^2$ at 380 KeV, respectively. See FIG. 2f which shows NPN collector contact also being implanted to lower resistance but the emitter region masked due to the depth of the implant.

(10) Strip photoresist 224 and dummy gate oxide 220; this will also remove about 20 nm of field oxide 218. Next, thermally grow gate oxide 226 to a thickness of about 9 nm, and deposit by LPCVD undoped polysilicon 227 (or amorphous silicon) to a thickness of 310 nm. Note that a gate oxide thickness of 9 nm will lead to an electric field of about 4.5 MV/cm for a gate voltage of 4 volts; so this process should provide 3.3 volt operation. Then spin on photoresist 228 and expose and develop it to define the locations of implants for NMOS gates and (optionally) the lower capacitor plate. Then implant phosphorus with a dose of $3\times10^{15}$ atoms/cm$^2$ at 50 KeV. See FIG. 2g.

(11) Strip photoresist 228; then deposit (e.g., TEOS plus ozone) oxide 230 to a thickness of 200 nm. Spin on photoresist and expose and develop it to define the location of capacitor bottom plates. Next, etch oxide 230 using the photoresist as the etch mask, and strip the photoresist. Then decompose POCl3 on the patterned oxide 230 and exposed polysilicon; this generates phosphorus dopants which diffuse into the exposed polysilicon. Perform the POCl3 doping at 900° C. for 30 minutes; this essentially saturates the exposed polysilicon with phosphorus and yields a resistivity of 25 ohm/square. This also diffuses the implanted phosphorus in the portion of polysilicon 227 which will eventually form the NMOS gates. The phosphorus diffuses roughly 1 um laterally under oxide 230 diffusion mask, so layout capacitor bottom plates spaced from the MOS devices. Note that a POCl3 doping of the NMOS gate polysilicon (instead of the implant of the foregoing step) likely would lead to some phosphorus diffusion through the thin gate oxide and into the channel region. See FIG. 2h which labels the POCl3 doped portion of polysilicon 227 as N+, the implant doped NMOS gate portion as N, and the remaining undoped polysilicon as I (intrinsic).

(12) Strip oxide 230, and deposit (LPCVD) nitride 232 to a thickness of 45 nm. Next, deposit second polysilicon layer 234 to a thickness of 310 nm. Then POCl3 dope polysilicon 234; the nitride prevents phosphorus diffusion into underlying polysilicon 227. Nitride 232 will be the capacitor dielectric, and polysilicon 234 the top capacitor plates. See FIG. 2i.

(13) Spin on photoresist 236 and expose and develop it to define the location of capacitor top plates. Next, etch polysilicon 234 and nitride 232 using the photoresist as the etch mask; see FIG. 2j. The etch could be a two-main-step plasma etch with Cl2+HBr to etch the polysilicon and CHF3+CF4 to etch the nitride.

(14) Strip photoresist 236. Spin on photoresist 238 and expose and develop it to define the locations of MOS gates, capacitor bottom plates, and poly resistors. Next, etch polysilicon 227 using the photoresist as the etch mask; see FIG. 2k. The MOS gates will be about 0.6 um long and with width dependent upon desired drive current. The capacitor plates will vary in size with a capacitance of roughly 1.4 fF/um$^2$ for the 45 nm thick nitride.

(15) Strip photoresist 238; then a short thermal oxidation will seal the sides of the poly gates and maintain the exposed gate oxide. Spin on photoresist 240 and expose and develop it to define the locations of NMOS devices except for eventual P well contacts, N well contacts in PMOS devices, and both the emitter and collector contact in the NPN bipolar. Then implant phosphorus with a dose of $6\times10^{13}$ atoms/cm$^2$ at 50 KeV; this forms the lightly doped drain implant for the NMOS and further dopes the gate plus the NPN emitter and collector contact; see FIG. 2l.

(16) Strip photoresist 240. Next, deposit a 200 nm thick conformal layer of nitride (or oxide), and anisotropically etch back the layer to leave sidewall spacers 242 on the gates plus the edges of the capacitor plates and resistor poly. With oxide sidewall spacers, the anisotropic etchback will also remove some field oxide, whereas nitride sidewall spacers allow better selectivity in the etchback. Sidewall spacers 242 have a thickness of about 200 nm at the base. After the etchback, a short thermal oxidation will regrown a screen oxide on the exposed silicon. See FIG. 2m.

(17) Spin on photoresist 244 and expose and develop it to define the locations of NMOS devices except for P well contacts, N well contacts in PMOS devices, the capacitor plates, and both the emitter and the collector contact in the NPN bipolar. Then implant phosphorus and arsenic to form self-aligned NMOS source/drains and further dope the NMOS gates plus the NPN emitter and collector contact. The arsenic has a dose of $3\times10^{15}$ atoms/cm$^2$ at 120 KeV and the phosphorus has a dose of $4\times10^{14}$ atoms/cm$^2$ at 50 KeV; see FIG. 2n.

(18) Strip photoresist 244. Spin on photoresist 246 and expose and develop it to define the locations of PMOS devices except for N well contacts (which were doped N+ in the previous implants), P well contacts in NMOS devices, the poly resistor, and the extrinsic base of the NPN bipolar. Then implant boron to form self-aligned PMOS source/drains and also dope the PMOS gates plus the NPN extrinsic base and the resistor. The boron has a dose of $3\times10^{15}$ atoms/cm$^2$ at 20 KeV; see FIG. 2o.

(19) Strip photoresist 246. Deposit (LPCVD) 100 nm thick layer 250 of oxide which will mask off silicon to prevent silicidation on the poly resistor and the NPN emitter periphery. Next, anneal to activate the source/drain implants. Then spin on photoresist 252 and expose and develop it to define the locations for silicidation. Lastly, etch oxide 250 using photoresist 252 as etch mask; this etch will also strip screen oxide to expose silicon for silicidation. See FIG. 2p.

(20) Strip photoresist 252. Deposit (sputtering) a 60 nm thick layer of titanium; and react (rapid thermal anneal at 700° C.) the titanium in a nitrogen atmosphere to form titanium silicide where the titanium abutted silicon and titanium nitride for the titanium on oxide or nitride. Strip the titanium nitride (plus any unreacted titanium metal) with a HCl+H2O2 solution to leave the silicide as illustrated in FIG. 2q. The silicide may be annealed to convert from C49 phase to C54 phase and thereby lower the resistivity. Note that self-aligned cobalt silicide or nickel silicide could analogously be formed in place of the titanium silicide. FIG. 2q shows capacitor 270, resistor 272, PMOS gate 274, NMOS gate 276, low threshold voltage NMOS gate 278, and NPN bipolar 280 with emitter contact 282, base contact 284, and collector contact 286.

(21) Deposit 1 um thick layer of dielectric 260, such as a stack of 100 nm of conformal undoped oxide followed by 900 nm of borophosphosilicate glass (BPSG), and planarize, such as by chemical mechanical polishing (CMP) or resist etchback. Next, spin on photoresist and expose and develop it to define the locations for vias (holes, contacts) to the various devices: source/drains, gates, emitters, bases, collector contacts, resistor ends, and capacitor plates. The vias may have a diameter of about 1 um, and multiple vias may be used to contact a single device although the silicidation provides a very low lateral resistance to lessen the need for multiple vias. Then anisotropically etch the dielectric masked by the photoresist; the etch stops on silicide, so the differing via depths do not pose an overetch problem. Strip the photoresist. Lastly, deposit metal 262 to fill the vias and cover planarized dielectric 260; and etch the metal with a photoresist mask to form first level metal interconnects. Strip the photoresist; see FIG. 2r which shows. Metal 262 may be a stack of 50 nm of sputtered TiN, 500 nm of Al (copper doped), and 50 nm of TiN. Alternatively, the vias may be filled with metal (such as TiN plus W) by a blanket deposition followed by etch back and the first level interconnects may then be formed by metal deposition (e.g., TiN, Al:Cu, TiN) and patterned etching to form first level interconnects.

(22) Repeat the foregoing step (with etch stops on first level metal) to form successively higher levels of metal interconnects.

Experimental results

Figure 4:
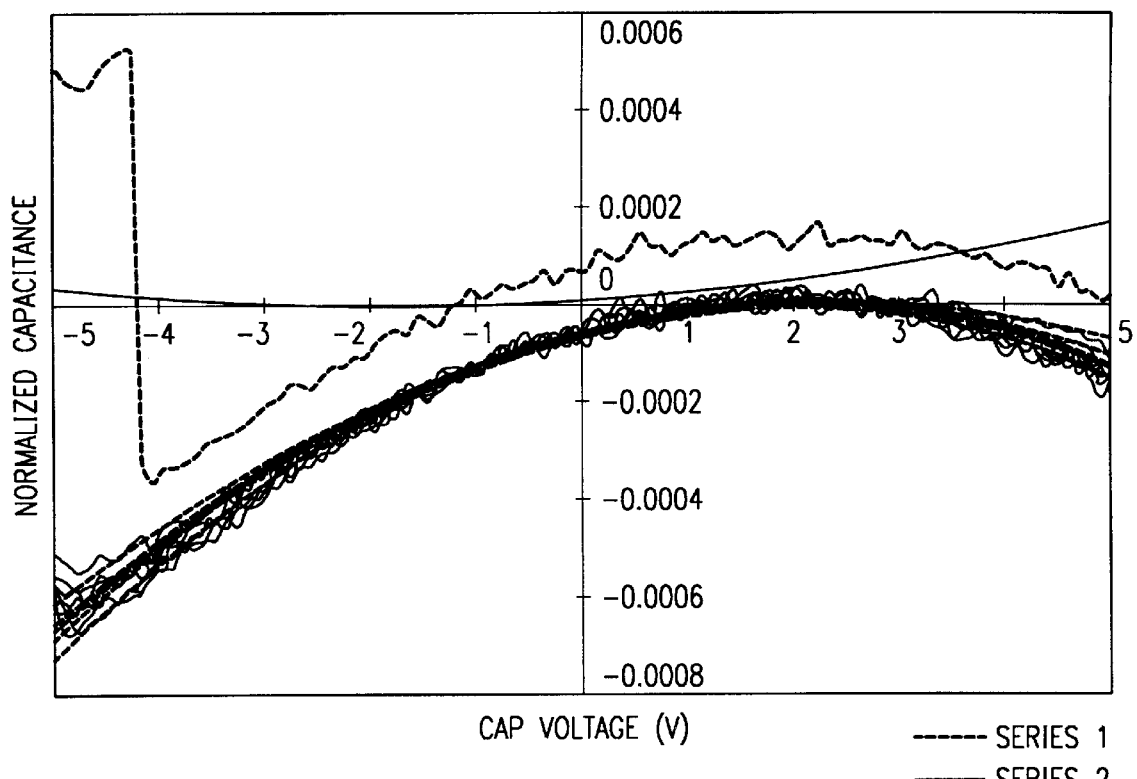
FIG. 4 illustrates experimental results.

FIG. 4 shows the capacitance dependence upon applied voltage. Note that the linear voltage coefficient (the change in capacitance with respect to the change in applied voltage) in parts per million per volt is about 15–20 ppm/V as compared with coefficients on the order of 100–200 ppm/V for implanted polysilicon plates even with very high implant doses of $1.3-1.6 \times 10^{16}$ atoms/cm$^2$.

Two capacitor types

Step (12) deposits a single nitride capacitor dielectric. Alternatives include two or more capacitor dielectrics so that a single integrated circuit could contain both high and low voltage capacitors and both high and low capacitance density capacitors. In particular, replace step (12) with the following steps:

Strip oxide 230, and deposit (LPCVD) nitride 301 to a thickness of 55 nm. Spin on photoresist and expose and develop it to define the dielectric difference between high and low capacitance density capacitors. Plasma etch the nitride 301 using the photoresist as etch mask and stopping on N+ polysilicon 227; see FIG. 3a which shows a high capacitance density capacitor area in the lefthand portion and a low capacitance density capacitor area in the righthand portion with the etched nitride 301 and photoresist.

Strip the photoresist and deposit (LPCVD) second nitride 232 to a thickness of 45 nm; this forms 100 nm total thickness nitride at nitride 301. Next, deposit second polysilicon layer 234 to a thickness of 310 nm. Then POCl3 dope polysilicon 234; the nitride prevents phosphorus diffusion into underlying polysilicon 227. Nitride 232 will be the capacitor dielectric for high capacitance density, low voltage capacitors; nitride 232 plus nitride 301 will be the capacitor dielectric for low capacitance density, high voltage capacitors; and polysilicon 234 the top capacitor plates for both types of capacitors. See FIG. 3b. The remainder of the fabrication for high capacitance density capacitors and low capacitance density capacitors are the same as described in the foregoing.

Alternative resistors

The polysilicon resistors of the first preferred embodiment received the PMOS source/drain P+ doping. Alternative resistors on in same integrated circuit could instead (by varying photoresist exposed areas) receive the N+ doping for the NMOS source/drains, the N doping for the NMOS lightly-doped drains, the initial NMOS gate doping, or any combination of these dopings or no doping at all, and in all of the light doping cases the contact ends of the resistor could still receive the heavy source/drain doping. This allows a range of resistivities for conveniently-sized resistors, and also varying thermal resistance dependencies.

Second poly gates

Another preferred embodiment modifies the foregoing preferred embodiments by using the second polysilicon layer for the MOS gates. That is, dope (POCl3) and etch the first level polysilicon to form the bottom capacitor plates; next, do gate oxide and capacitor dielectric formations, and then dope (masked POCl3 and implant) and etch to form gates and top capacitor plates. Likewise, floating gate transistors could use the both polysilicon levels.

Modifications

The preferred embodiments can be modified in various ways while retaining the feature of a masked diffusion doping of a polysilicon layer subsequently etched to form gates and capacitor plates.

For example, the N type implant prior to polysilicon etching to form NMOS gates could be omitted and the self-aligned source/drain implant relied on for gate doping. Similarly, the self-aligned silicidation could be omitted and metal contact could have an initial titanium deposition followed by reaction to form titanium silicide at metal-(poly)silicon interfaces. The masked diffusive doping could be with materials other than POCl3.

What is claimed is:

1. A method of fabrication of an integrated circuit, comprising the steps of:
   (a) masked doping a portion of a polysilicon layer;
   (b) forming a capacitor dielectric on said polysilicon layer;
   (c) forming a capacitor plate layer on said capacitor dielectric; and
   (d) removing portions of said polysilicon layer, said capacitor dielectric layer, and said capacitor plate layer to form at least one capacitor.

2. The method of claim 1, wherein:
   (a) said removing portions of said polysilicon layer of step (d) of claim 1 also forms transistor gates.

* * * * *